United States Patent [19]
Brown

[11] Patent Number: 5,371,475
[45] Date of Patent: Dec. 6, 1994

[54] LOW NOISE OSCILLATORS AND TRACKING FILTERS

[75] Inventor: Anthony K. D. Brown, Kanata, Canada

[73] Assignee: Northern Telecom Limited, Montreal, Canada

[21] Appl. No.: 70,828

[22] Filed: Jun. 3, 1993

[51] Int. Cl.$^5$ ............................ H03H 1/00; H03H 3/00
[52] U.S. Cl. ............................ 330/254; 330/252; 330/253; 330/305; 330/306
[58] Field of Search ............ 303/252, 254, 306, 253, 303/306

[56] References Cited

U.S. PATENT DOCUMENTS

| | | | |
|---|---|---|---|
| 4,460,872 | 7/1984 | Mattisson | 330/252 |
| 5,172,076 | 12/1992 | Brown | 331/57 |
| 5,185,581 | 2/1993 | Brown | 330/254 |

FOREIGN PATENT DOCUMENTS 0234612  9/1988  Japan .................... 330/252

OTHER PUBLICATIONS

"Phase Noise in Signal Sources (Theory and Applications)", W. P. Robins, 1982, Peter Peregrinus Ltd.
"Design Considerations in High–Frequency CMOS Transconductance Amplifier Capacitor (TAC) Filters", Krummenacher, 1989 IEEE Int'l Symposium on Circuits and Systems.
"Analog Integrated Circuit Design", Van Nostrand Reinhold Ltd., Canada, 1972, pp. 291–292.
"Electronic and Radio Engineering", F. E. Terman, 4th Edition, McGraw Hill Book Company Inc., 1955, New York, p. 45.
"Synthesizing Active Filters", S. Mitra, IEEE Spectrum, Jan. 1969, pp. 47–63.

*Primary Examiner*—Anita Pellman Gross
*Assistant Examiner*—Fetsum Abraham
*Attorney, Agent, or Firm*—George MacGregor

[57] ABSTRACT

A gyrator based resonator comprises first and second differential amplifiers cross coupled to form a quadrature phase voltage controlled oscillator. The differential amplifier circuits include matched transistor pairs and associated transconductance adjusting components to control the resonant frequency of the resonator. Transconductance delay and admittance loss elements are also provided and these elements serve to control the loop gain of the resonator. A loop gain greater than unity results in the resonator oscillating while a loop gain less than unity produces a bandpass filter. A resonator having gain less than unity may be slaved to a similar resonator having gain adjusted to be greater than unity thus creating a low noise oscillator and tracking filter.

23 Claims, 7 Drawing Sheets

LOW NOISE OSCILLATORS AND TRACKING FILTERS

RELATED APPLICATIONS

This application is related to U.S. application No. 07/857,909, (now U.S. Pat. No. 5,172,076 issued Dec. 15, 1992) and U.S. application Ser. No. 07/858,269, (now U.S. Pat. No. 5,185,581 issued Feb. 9, 1993) both of which are incorporated herein by reference.

FIELD OF THE INVENTION

This invention relates to differential amplifiers and to high quality factor voltage controlled oscillator circuits with matched high quality factor tracking filters constructed from such differential amplifiers. The principles of the design can be implemented in silicon integrated circuit technology and in Heterojunction Bipolar Technology. Some of the features of the design can also be implemented in MOS and GaAs technology.

BACKGROUND OF THE INVENTION

A conventional differential amplifier comprises a matched pair of bipolar transistors, a matched pair of load impedances, and a current source. Each load impedance is connected between a voltage supply and a collector of a respective one of the transistors, and emitters of both transistors are connected to the current source. Differential inputs are applied to bases of the transistors, and differential outputs are taken from the collectors of the transistors.

Two such differential amplifiers can be cross-coupled to construct a quadrature phase Voltage Controlled Oscillator (VCO) which oscillates with ninety degree phase shift across each differential amplifier and with one hundred and eighty degree phase shift in the cross-coupled feedback loop.

Unfortunately, typical manufacturing process variations affect the oscillating frequency of such VCOs so that such VCOs must be tuned after manufacture if oscillation at a particular oscillation frequency is required. W. P. Robins proposes tuning by means of varactor diodes which may be coupled between the collectors and the matched transistors in each differential amplifier (see PHASE NOISE IN SIGNAL SOURCES - THEORY AND APPLICATIONS, Peter Peregrinus Limited). Unfortunately, this method requires pretrimming of the load impedances to center the oscillation frequency because the tuning range achievable with varactor diodes alone cannot cope with circuit parameter variations which result from typical manufacturing process variations. Moreover, the resulting VCO typically has a fairly low quality factor (Q) due to non-linearities in the circuit parameters.

In Applicant's U.S. Pat. No. 5,185,581, referred to hereinbefore, there is disclosed a differential amplifier which can be used to construct voltage controlled oscillators and other high frequency resonant circuits while providing a tuning range which is sufficient to cope with circuit parameter variations which result from typical manufacturing process variations. In U.S. Pat. No. 5,185,581 the phase shift of the differential amplifier is controlled by the emitter current density of the differential pair. A major disadvantage of this approach is that the gain of the amplifier and consequently the power output of the oscillator are also controlled by the emitter current density.

In a paper entitled DESIGN CONSIDERATIONS IN HIGH-FREQUENCY CMOS TRANSCONDUCTANCE AMPLIFIER CAPACITOR (TAC) FILTERS by F. Krummenacher, 1989 IEEE International Symposium on Circuits and Systems, one approach of tuning the frequency and Q factor of gyrator-based resonators is disclosed. This approach, applicable with MOS devices, works at frequencies of up to 100 MHz and yields a reported gyrator Q factor of about 10.

SUMMARY OF THE INVENTION

The present invention provides a differential amplifier which operates on a different principle to effect tuning in the UHF band while achieving higher quality factors and lower phase noise.

Therefore, in accordance with a first aspect of the present invention there is provided a differential amplifier, comprising a current source for supplying a substantially constant bias source; a current dividing circuit for controllably dividing the substantially constant bias source between first and second current paths; a pair of matched load impedances; a first pair of matched transistors connected as a differential pair between the matched load impedances and the first current path; a second pair of matched transistors connected as a differential pair between the matched load impedances and the second current path, with differential inputs of the second differential pair connected to corresponding differential inputs of the first differential pair and; tuning means associated with one of said first or second pairs of matched transistors to vary the effective transconductance thereof.

In accordance with a second embodiment of the invention there is provided a gyrator-based resonator comprising first and second differential amplifiers as described hereinabove. The positive input of the second differential amplifier is connected to the positive output of the first differential amplifier, the negative input of the second differential amplifier is connected to the negative output of the first differential amplifier, the positive input of the first differential amplifier is connected to the negative output of the second differential amplifier and the negative input of the first differential amplifier is connected to a positive output of the second differential amplifier.

The gyrator based resonator is provided with a controlled transconductance delaying means and an adjustable loss admittance means, both of which are operable to vary the loop gain of the resonator. When the loop gain is greater than unity, the resonator operates as an oscillator and when the loop gain is less than unity, the resonator operates as a filter.

In accordance with a third aspect of the invention there is provided a combination oscillator and tracking filter comprising first and second interconnected gyrator-based resonators. The first resonator has a loop gain greater than unity to operate as an oscillator and the second resonator has a loop gain less than unity to operate as a tuned filter.

BRIEF DESCRIPTION OF THE ACCOMPANYING DRAWINGS

Embodiments of the invention are described below by way of example only. Reference is made to accompanying drawings in which.

DESCRIPTION OF THE EMBODIMENTS

Prior to describing the gyrator-based resonator of the present invention an overview of gyrator theory and in particular with respect to a voltage controlled oscillator will be presented. Where appropriate, reference to the differential amplifier of the invention will be included.

In this description reference will be made to inductive impedances shunted by resistive impedances. For clarity it is understood that the Q factor of the inductor L with shunt resistive impedance $R_p$ is given by:

$$Q = \frac{2\pi\left(\frac{v^2}{2L}\right)}{2\pi\left(\frac{v^2}{2R_p}\right)} = \frac{R_p}{L} \qquad \text{(EQ 1)}$$

The Q factor of an inductor L with series resistive impedance $R_s$ is given by:

$$Q = \frac{2\pi\left(\frac{i^2 L}{2}\right)}{2\pi\left(\frac{i^2 R_s}{2}\right)} = \frac{L}{R_s} \qquad \text{(EQ 2)}$$

Figure 1:
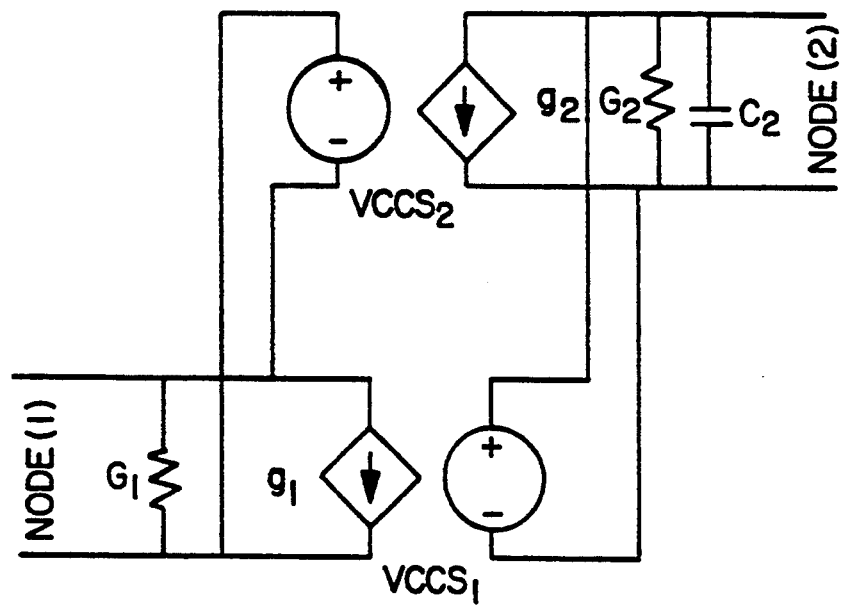
FIG. 1 is a circuit diagram of a classical gyrator model.

A classical gyrator circuit is shown in FIG. 1. The capacitive impedance presented at one port is transformed into an inductive impedance at the other. If capacitors are placed at both ports then the circuit becomes a parallel LRC resonant circuit. The impedance seen at both ports is identical if the circuit is symmetrical, but at resonance the waveforms at the two ports are phase shifted by 90°. The ideal voltage controlled current sources approximate the differential pairs of the resonator circuit to be described later.

The gyrator circuit shown in FIG. 1 is considered stable. The inductive reactance seen at the input port is described as a passive component, even though this circuit is referred to as a non ideal gyrator with losses due to admittances $G_1$ and $G_2$. However, the voltage controlled current sources are assumed to still be ideal and in a practical implementation this will not be the case. Amongst other non idealities of practical voltage controlled current sources, built in delay will always occur. For example if the voltage controlled current sources are approximated by a simple bipolar differential pair, the phase shift in the transconductance may be significant.

The inductive reactance seen at the input port of the gyrator of FIG. 1 can be easily calculated. Assume initially that the admittances $G_1$ and $G_2$ are zero. Assume a voltage source at Node (1) of unit magnitude. Then the voltage seen at Node (2) is $g_2/j\omega C_2$. This voltage in turn reflects a current into the input unit voltage source of magnitude $g_1 g_2/j\omega C_2$. The input impedance is therefore $j\omega C_2/(g_1 g_2)$, and this is clearly inductive. By a similar process it may be shown that real admittances $G_1$ and $G_2$ determine the Q of the inductor. Thus $$L = \frac{C_2}{g_1 \cdot g_2} \qquad \text{(EQ 3)}$$

The simple gyrator model of FIG. 1 can be made into a resonant circuit by placing an additional capacitor $C_1$ across Node (1). In this case the Node (1) capacitance resonates with the gyrator inductance with a period given by $$\tau_{LC} = 2\pi\sqrt{\frac{C_1 \cdot C_2}{g_1 \cdot g_2}} = \frac{2\pi}{\omega_0} \qquad \text{(EQ 4)}$$

Here $C_1$, $C_2$ are the capacitors driven by the Voltage Controlled Current Sources (VCCS) $g_1$, $g_2$ respectively.

The frequency of resonance is therefore controlled by the capacitance and the transconductance.

As described so far, this resonator is stable. If the non idealities associated with the admittances $G_1$ and $G_2$ are negligible, the poles of the gyrator lie on the imaginary s-plane axis, and in the limit, as $G_1=G_2\rightarrow$zero, the loop gain at resonance $>$ unity. If $G_1$ and $G_2$ are not negligible, they have the effect of moving the poles gradually into the left hand s-plane and the gyrator remains stable: also the loop gain at resonance becomes less than unity. However, if the period of the resonance is short enough so that the non idealities of the voltage controlled current sources are no longer negligible, then the circuit may oscillate. Thus a small delay in the VCCS has the effect of moving these poles towards and into the right half of the s-plane and so creating a loop gain greater than unity at the resonant frequency. It has been found that the amount of delay required to cause oscillation is quite small compared to the resonator period. This behaviour is now described analytically as follows.

Figure 2:
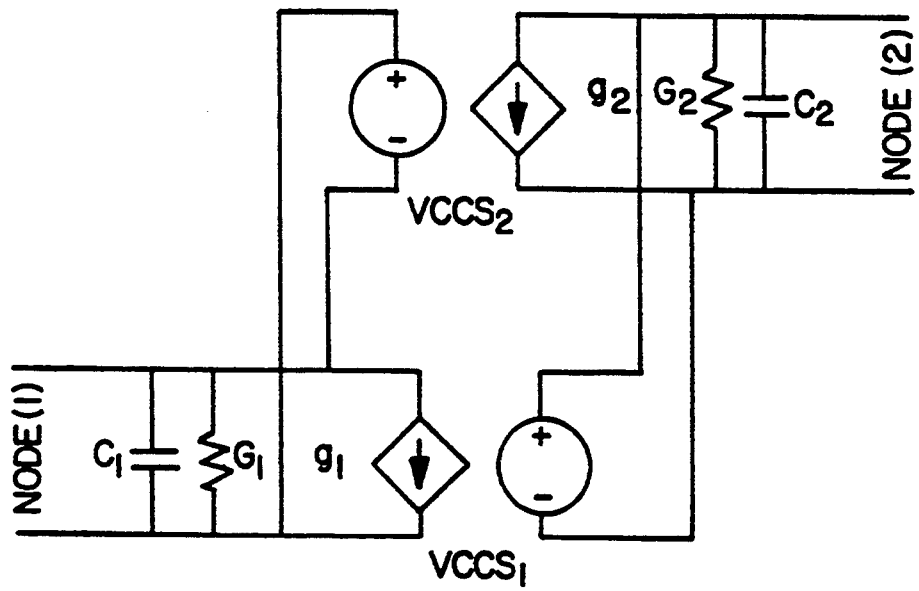
FIG. 2 is a circuit diagram of a gyrator as a non-ideal resonator.

The gyrator as a non ideal resonator is shown in FIG. 2, here the delays of the VCCS are considered negligible. Also, initially assume $G_1=G_2=0$. The gain across VCCS$_2$ is clearly $$\text{Gain}_{12} = \frac{g_2}{j\omega C_2} \qquad \text{(EQ 5)}$$

Similarly for the gain across VCCS$_1$, hence the loop gain $\Gamma$ is:

$$\Gamma = \left(-\frac{g_1 \cdot g_2}{j\omega C_1 \cdot j\omega C_2}\right) \qquad \text{(EQ 6)}$$

Hence:

$$\Gamma = \frac{g_1 \cdot g_2}{\omega^2 \cdot C_1 \cdot C_2} \quad \text{(EQ 7)}$$

However, at resonance, $$\omega_0 = \frac{1}{\sqrt{LC}} = \frac{1}{\sqrt{\frac{C_1 \cdot C_2}{g_1 \cdot g_2}}} \quad \text{(EQ 8)}$$

Hence, at resonance, when $G_1=G_2=0$, substituting Equation [8] in Equation [7], we find the loop gain is unity.

When $G_1$ and $G_2$ are finite, but small compared to $g_1$ and $g_2$, the gain across $VCCS_2$ is:

$$\text{Gain}_{12} = g_2(j\omega C_2 + G_2)^{-1} \quad \text{(EQ 9)}$$

Similarly for the gain across $VCCS_1$.
Whence the loop gain $\Gamma$ is:

$$\Gamma = -g_1 g_2 ((j\omega C_1 + G_1) \cdot (j\omega C_2 + G_2))^{-1} \quad \text{(EQ 10)}$$

For the moment, assume $g_1=g_2=g$, $C_1=C_2=C$, $G_1=G_2=G$, then the loop gain becomes $$\Gamma = (-1)g^2(j\omega C + G)^{-2} \quad \text{(EQ 11)}$$

To determine the dependence of the Loop Gain $\Gamma$ upon the admittance G, we can differentiate $\Gamma$ with respect G:

$$\frac{\partial \Gamma}{\partial G} = 2g^2(j\omega C + G)^{-3} = -\frac{2 \cdot \Gamma}{j\omega C + G} \quad \text{(EQ 12)}$$

The gradient of the gain with respect to G is clearly negative, indicating that the admittance G only serves to stabilize the gyrator resonator by reducing the loop gain to less than unity for finite small real G (that is, small with respect to g).

The impedance seen at node (2) due to $C_2$ and $G_2$ is:

$$P \; Z_2 = (G_2 + j\omega C_2)^{-1} \quad \text{(EQ 13)}$$

The reflected impedance at node (1) is:

$$Z_{reflected} = \frac{G_2 + j\omega C_2}{g_1 \cdot g_2} \quad \text{(EQ 14)}$$

Note that while the loop gain of Equation [11] requires a negative sign to account for the phase reversal of the output of $g_1$, the impedance of Equation [14] does not require a negative sign since it represents a positive loss.

The reflected impedance is a lossy inductive impedance, with parallel resistive and inductive components (1G') and $j\omega L$ respectively, so that $$\left(G' + \frac{1}{j\omega L}\right)^{-1} = \frac{G_2 + j\omega C_2}{g_1 \cdot g_2} \quad \text{(EQ 15)}$$

Equating real and imaginary parts yields:

$$G' = \frac{g_1 \cdot g_2 \cdot G_2}{G_2^2 + \omega^2 \cdot C_2^2} \approx \frac{g_1 \cdot g_2 \cdot G_2}{\omega^2 \cdot C_2^2} \quad \text{(EQ 16)}$$

and:

$$L = \frac{G_2^2 + \omega^2 C_2^2}{g_1 g_2 \omega^2 C_2} \approx \frac{C_2}{g_1 \cdot g_2} \quad \text{(EQ 17)}$$

According to Alan B. Grebene, (ANALOG INTEGRATED CIRCUIT DESIGN, pages 291–292, 1972, Van Nostrand Reinhold Ltd., Canada), the effective Q of the reflected inductive impedance can be calculated as the ratio of the shunt resistive impedance to the reactive inductive impedance and this yields Q as:

$$Q = (\omega L(G' + G_1))^{-1} \approx \frac{\omega C_2 g_1 g_2}{G_1 G_2 + G_2 g_1 g_2 + \omega^2 C_2^2 G_1} \quad \text{(EQ 18)}$$

A maximum value for Q at any given frequency can be calculated as:

$$Q_{max} \approx \frac{g_1 g_2}{2(g_1 g_2 + G_1 G_2)} \sqrt{1 + \frac{g_1 g_2}{G_1 G_2}} \quad \text{(EQ 19)}$$

From this one may observe that the Q of the inductor may be extremely large if either $G_1$ or $G_2$ is very small.

Caution is necessary in applying Equations [18] and [19] since Grebene's method of calculating Q following Equation [1] violates the formal definition upon which Equation [1] is based, namely, that the inductance L of Equation [1] is a pure inductance with no loss components and the shunt resistance $R_p$ of Equation [1] is a pure resistance with no reactive components. As defined by Equations [16] and [17] the inductance and resistance do contain second order terms which therefore render Equations [18] and [19] to be approximations only, which are good for large values of Q.

The nodal impedance seen at node (1) is calculated from the combined parallel impedance of $G_1$, $G'$, $C_1$ and L as:

$$Z_1 = \left(G_1 + G' + \frac{1}{j\omega L} + j\omega C_1\right) = \quad \text{(EQ 20)}$$

$$\frac{G_2 + j\omega C_2}{((G_1 + j\omega C_1) \cdot (G_2 + j\omega C_2)) + g_1 g_2}$$

From this we can conclude that the nodal impedance at either node (1) or node (2) is predominantly controlled by $C_1$, $C_2$ and the product $(g_1 \cdot g_2)$. It is not controlled by the ratio $(g_1/g_2)$. Also, approximately, the radio $Z_1/Z_2$ is equal to $C_2/C_1$ at resonance.

Consider, now, the effects of non idealities in the gyrator transductors which are particularly apparent in bipolar transistors at microwave frequencies. This approach leads to a new theory of gyrators as Voltage Controlled Oscillators up to microwave frequencies. In this analysis we continue to model the gyrator transconductors as Voltage Controlled Current Sources.

Now, if the Voltage Controlled Current Sources are no longer considered ideal, but have a finite delay in them, this delay can be represented in one of two ways, namely, intrinsic delays which are purely internal to the VCCS, and external delays which could for example be an RC delay which loads the input and output ports of the resonator with a complex impedance. For practical values of the delay, both these types of delays have qualitatively the same effect. To put a physical interpretation on these delays, the intrinsic delay is particularly encountered at very high frequencies where for example, charge distribution in the collector base junction region of bipolar transistors gives rise to phase shift of transconductance with frequency. On the other hand, the external delay at very high frequencies could be associated with the base resistance and charge distribution across the base emitter junction. It should be noted that in gyrator theory prior art the transconductance delay has not been considered. We show that the delay is a desirable attribute which may be artificially enhanced for its effect.

Figure 3:
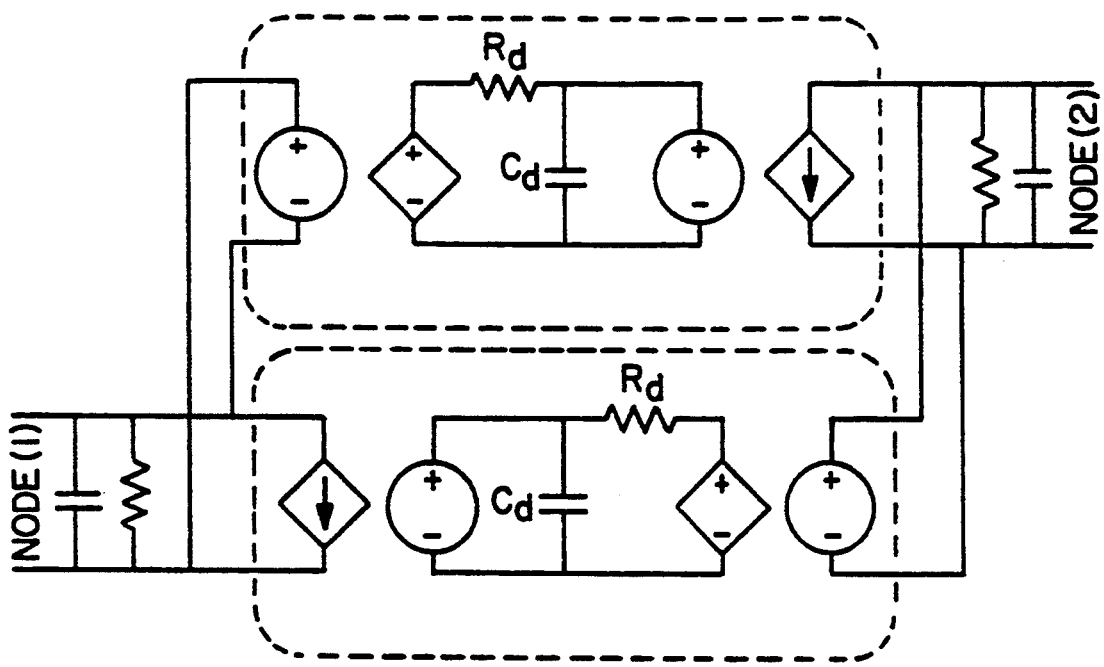
FIG. 3 is a circuit diagram of a gyrator with non-ideal voltage controlled current sources.

To emulate a VCCS which has built in intrinsic delay, each VCCS of FIG. 2 is augmented with a unity gain Voltage Controlled Voltage Source and an RC delay circuit as shown in FIG. 3. The VCVS serves the purpose of buffering the internal delay so that it does not load the original gyrator admittances. For the present purposes it will be assumed that the introduced delay is the same for both VCCS and its value is ($R_d.C_d = D$). We can now find an expression for the new loop gain $\Gamma$ by modifying Equation [11]. The delay circuit ($R_d.C_d$) modifies the loop gain $\Gamma$ as shown in Equation [21].

$$\Gamma = -g_1 g_2 \left( (j\omega C_1 + G_1)^{-1} \cdot (j\omega C_2 + G_2)^{-1} \cdot \left( \frac{1}{1 + j\omega C_d R_d} \right)^2 \right) \quad \text{(EQ 21)}$$

We may determine the effect of the VCCS delay on the loop gain $\Gamma$ by partial differentiation with respect to $C_d$ (or $R_d$), and for convenience replace the product $C_d.R_d$ by D, thus:

$$\frac{\partial \Gamma}{\partial D} = -g_1 g_2 \left( (j\omega C_1 + G_1)^{-1} \cdot (j\omega C_2 + G_2)^{-1} \cdot \left( \frac{2}{1 + j\omega D} \right) \cdot \left( \frac{-j\omega}{(1 + j\omega D)^2} \right) \right) \quad \text{(EQ 22)}$$

$$= -g_1 g_2 \left( (j\omega C_1 + G_1)^{-1} \cdot (j\omega C_2 + G_2)^{-1} \cdot \left( \frac{-2j\omega}{(1 + j\omega D)^3} \right) \right) \quad \text{(EQ 23)}$$

Using the Binominal theorem, Equation [23] reduces to:

$$\frac{\partial \Gamma}{\partial D} = \Gamma \cdot (2\omega D(3 - \omega^2 D^2) - 2j\omega(1 - 3\omega^2 D^2)) \quad \text{(EQ 24)}$$

From Equation [24] it is readily seen that the real part of the loop gain increases with increasing delay D for values of $D < 1.732/\omega$, that is for all practical values of D, and a condition for oscillation can be established by increasing D sufficiently to compensate for $G_1$ and $G_2$. We can attempt to find the limiting condition by evaluating Equation [21] under the constraint that the loop gain $\Gamma$ is unity, however we present a physical interpretation first of all, as follows.

From Equation [21], the delay $R_d C_d = D$ increases the period of the natural resonant frequency (for now designated $\omega'$) of the gyrator by an amount $\delta t$ where:

$$\delta t = 2 \cdot \text{atan}(\omega' D) \quad \text{(EQ 25)}$$

Equation [25] can be expanded to yield:

$$\delta t = 2 \left( (\omega' D) - \frac{((\omega' D)^3)}{3} + \frac{(\omega' D)^5}{5} - \frac{(\omega' D)^7}{7} + \ldots \right) \quad \text{(EQ 26)}$$

Thus the natural frequency has decreased by the ratio $\omega'/\omega_0$, where:

$$\frac{\omega'}{\omega_0} = \frac{\pi}{\pi + \text{atan}(\omega' D)} \quad \text{(EQ 27)}$$

From Equation [21], for small $R_d C_d = D$ and small $G_1, G_2$, it is intuitively obvious that at the lower natural frequency $\omega'$ the loop gain $\Gamma$ is increased due to the dominant terms $j\omega' C_1$, $j\omega' C_2$. This is the most obvious physical reason why the gyrator can oscillate.

We may further analyze Equation [21] under the limiting condition of unity gain ($\Gamma = 1$) and determine the required delay D ($= C_d.R_d$) to compensate the losses due the admittances $G_1$ and $G_2$. For simplicity, assume $G_1 = G_2 = G$, also $g_1 = g_2 = g$, and $C_1 = C_2 = C$. Equation [21] then becomes:

$$\Gamma = (-g^2) \cdot ((j\omega C + G)^{-2} \cdot (1 + j\omega D)^{-2}) = 1 \quad \text{(EQ 28)}$$

Taking the square root we have:

$$gj = (j\omega C + G)(1 + j\omega D) = j\omega C + j\omega GD + G - \omega^2 CD \quad \text{(EQ 29)}$$

Since the real and imaginary parts of Equation [29] are orthogonal, we obtain two orthogonal properties of the unity gain condition by equating the imaginary parts to yield Equation [30] and the real parts to yield Equation [31]:

$$\omega'_0 = \frac{g}{C + GD} \quad \text{(EQ 30)}$$

$$D = \frac{G}{\omega_0^2 C} \quad \text{(EQ 31)}$$

Equations [30] and [31] are the conditions for unity gain and by their derivation these conditions are orthogonal. Thus Equation [30] defines the angular resonant frequency $\omega'_0$ by transconductance g and capacitance C and is substantially independent of the loss admittance G and delay D since the product GD is a second order term. On the other hand it can be shown that Equation [31] defines the condition for maximum Q factor. Thus Q can be adjusted independently of $\omega'_0$ which is already defined by C and g. The requirement for oscillation is that delay D must be greater than the limiting value of Equation [31]. It is clear that the unity gain condition defining the Q factor has equal sensitivity to G and D. A solution for optimum oscillator Q factor will be proposed such that the loss G will be adjusted by AGC for a particular delay D so that Equation [31] is approximately satisfied.

We can now calculate the Q factor of the resonator at unity gain; intuitively we feel that this should be practically infinite. The reflected impedance from the gyrator seen at node (1) is:

$$Z_{reflected} = \frac{(G_2 + j\omega C_2)(1 + j\omega D_1)(1 + j\omega D_2)}{g_1 g_2} \quad \text{(EQ 32)}$$

From this the shunt resistive and inductive reactive impedances can be found. Equating real and imaginary parts yields real admittance G' and inductance L:

$$G' = \frac{g_1 g_2 (G_2(1 - \omega^2 D_1 D_2) - \omega^2 C_2(D_1 + D_2))}{(G_2^2 + \omega^2 C_2^2)(1 + \omega^2 D_1^2)(1 + \omega^2 D_2^2)} \quad \text{(EQ 33)}$$

$$L = \frac{(G_2^2 + \omega^2 C_2^2)(1 + \omega^2 D_1^2)(1 + \omega^2 D_2^2)}{\omega^2 g_1 g_2 (-C_2 + \omega^2 D_1 D_2 C_2 - G_2(D_1 + D_2))} \quad \text{(EQ 34)}$$

As before, Equation [18], following Grebene, we can calculate the Q of the inductive component as $$Q = (\omega L (G + G'))^{-1} \quad \text{(EQ 35)}$$

$$= \frac{\omega g_1 g_2 (-C_2 + \omega^2 D_1 D_2 C_2 - G_2(D_1 + D_2))}{g_1 g_2 (G_2(1 - \omega^2 D_1 D_2) - \omega^2 C(D_1 + D_2)) + G_1(G_2^2 + \omega^2 C_2^2)(1 + \omega^2 D_1^2)(1 + \omega^2 D_2^2)}$$

If we assume for the moment that $G_1 = G_2 = G$, $g_1 = g_2 = g$, $D_1 = D_2 = D$, and $C_1 = C_2 = C$, then the Q of the inductive component becomes:

$$Q = \frac{\omega g^2 (-C + \omega^2 D^2 C - 2GD)}{g^2 (G - \omega^2 GD^2 - 2\omega^2 CD) + (G^3 + \omega^2 GC^2)(1 + \omega^2 D^2)^2} \quad \text{(EQ 36)}$$

Equation [36] is somewhat cumbersome, however using normalized values and with G=0.05 and D=0.055 so that admittance G and delay D are matched to within 10%, Q factors of well over 100 can be obtained. A method for matching G and D will be described later.

As noted before with reference to Equations [18] and [19], this derivation of Q is approximate due to the presence of second order loss terms in the Inductance as well as second order reactive terms in the Admittance. If the loss G is small, then under the conditions for unity gain given by Equations [29], [30] and [31], the terms in the denominator of Equations [36] approximately cancel and the expression for Q approaches infinity. Using an alternative method for estimating the Q factor under unity gain conditions we can show that the correct value for Q without approximations is infinite and the proof of this follows.

From the condition for the unity gain condition the Q factor can be found alternatively by evaluating the gyrator nodal impedance. From Equation [32] the nodal impedance is given by:

$$Z_{nodal} = \quad \text{(EQ 37)}$$

$$\left( G_1 + j\omega C_1 + \frac{g_1 g_2}{(G_2 + j\omega C_2)(1 + j\omega D_1)(1 + j\omega D_2)} \right)^{-1}$$

Substituting Equation [29] in Equation [37] we have:

$$Z_{nodal} = \left( \frac{jg_1}{1 + j\omega_0' D_1} - \frac{jg_1}{1 + j\omega_0' D_1} \right)^{-1} = \infty \quad \text{(EQ 38)}$$

Thus the nodal impedance rises to infinity at the resonant frequency of a gyrator with unity gain. This is equivalent to infinite Q factor. From the formal definition of Q factor (F. E. Terman, ELECTRONIC AND RADIO ENGINEERING, page 45, Fourth Edition, 1955, McGraw Hill Book Company Inc., New York), the Q of a circuit is defined as $2\pi$ times the energy stored in the circuit divided by the energy dissipated in the circuit in one cycle. Under unity gain conditions, positive feedback compensates the energy loss so that the effective energy loss is zero and its reciprocal is infinite, resulting in infinite Q factor without the need for an infinite physical parameter. This is equivalent to compensating the loss impedance G with a negative impedance (due to positive feedback). Previous work reported by S. K. Mitra (SYNTHESIZING ACTIVE FILTERS, IEEE Spectrum, January 1969, pages 47-63) and others has led to their conclusion that the enhancement of the Q factor of a gyrator by means of a negative impedance is not satisfactory due to sensitivity and stability considerations. Our approach overcomes these objections and obtains stability by means of a self-adjusting control mechanism.

In a practical design, considerations of amplifier linearity and level control limit the ability to obtain and maintain true unity gain. These are the parameters which limit the resulting Q factor and will be discussed in more detail with reference to a practical oscillator.

we can now define a normalized delay parameter $D_n$ and a normalized loss parameters $G_n$ for the gyrator resonator:

$$G_n = \frac{G}{\omega_0 C} \quad \text{(EQ 40)}$$

It may be remarked that $G_n$ is the reciprocal of the nodal capacitive Q factor.

Also we can define a ratio $K_n$ $$K_n = \frac{D_n}{G_n} \quad \text{(EQ 41)}$$

Substituting the normalized parameters in Equations [30] and [31] for the unity gain condition we obtain:

$$\omega_0' = \frac{g}{C(1 + G_n D_n)} \quad \text{(EQ 43)}$$

Figure 4:
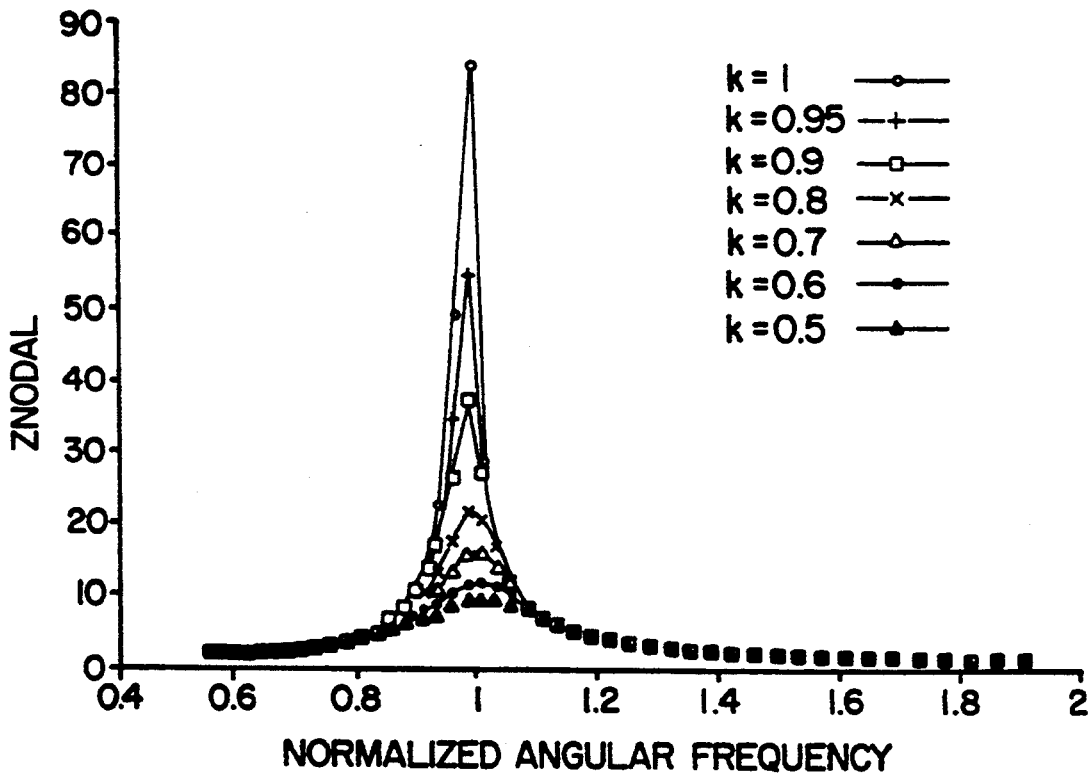
FIG. 4 is a graph of gyrator nodal impedance as a function of the ratio of normalized delay parameter and normalized loss parameter and frequency.

Equations [42] and [43] are the normalized conditions for unity gain and particularly emphasize the way the delay effectively cancels the circuit loss and permits extremely high Q factors to be obtained. This is further demonstrated in FIG. 4 which shows how the nodal impedance, and hence the Q factor increases as the ratio $K_n$ increases towards unity. Here $G_n = 0.1$, $\omega_0' \approx 1$, G=1, C=1, so that at $K_n = 1 \omega_0'$ is shifted only 1% below the ideal value due to the product $G_n \cdot D_n$ in Equation [43]. Even when the delay $D_n$ and loss parameter $G_n$ are matched to only 10%, ($K_n=0.9$), considerable improvement in the Q factor is obtained, in this case a factor of 10. In general we can define the Q improvement factor as $(1-K_n)^{-1}$.

At this point it is helpful to aid our understanding of the behaviour of the gyrator with built in delay by means of a pole-zero analysis.

Figure 5:
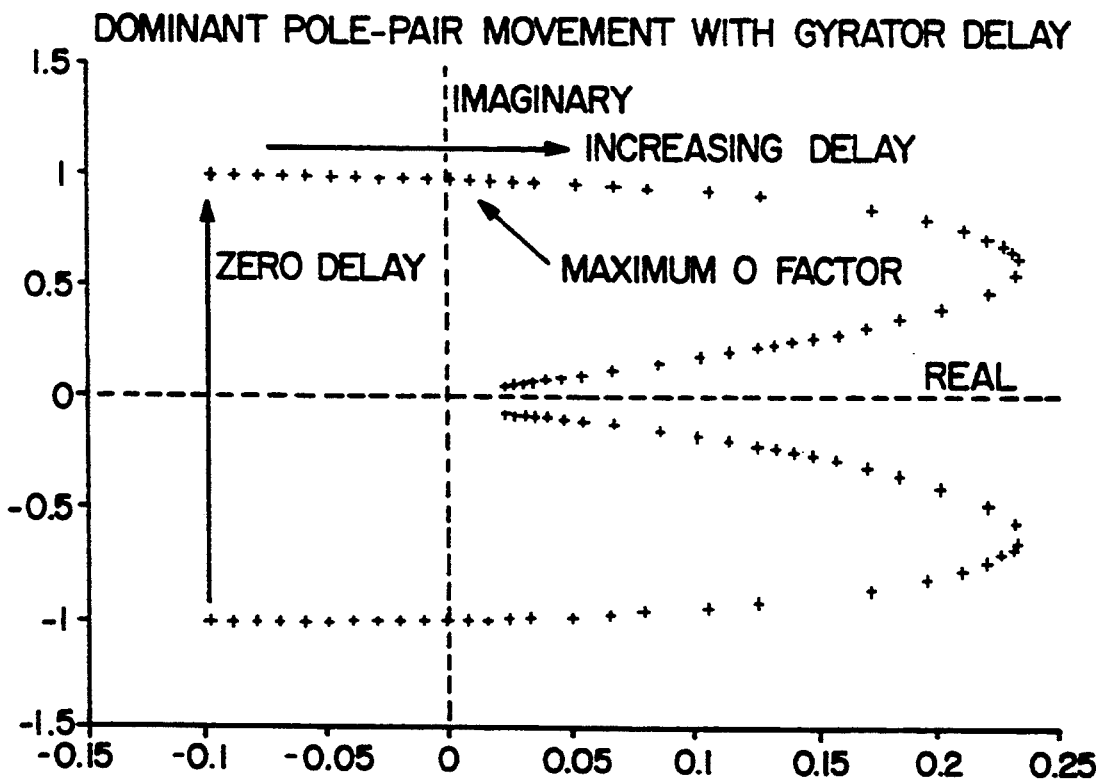
FIG. 5 is a graph illustrating dominant pole pair movement for a gyrator with delay D.

This analysis confirms many of the principles derived in the foregoing section. For example, the impedance of a simple gyrator with zero loss ($G_1=G_2=0$) and zero delay ($D_1=D_2=0$) has a single pole pair on the imaginary axis of the s-plane, corresponding to infinite Q factor. If the loss is increased, this dominant pole pair moves into the negative real left hand half of the s-plane, resulting in the traditional 'stable' gyrator circuit as described in standard works such as Grebene. If the gyrator transconductance delay is now introduced, the dominant pole pair moves towards the positive real right hand half of the s-plane and crosses over into it as the delay is increased. Once the dominant pole pair is in the right hand plane, the condition for oscillation is established. As far as the Applicant is aware, this property of gyrators with built in delay has not previously been disclosed. A significant factor is that the value of the dominant pole pair, or gyrator resonant frequency, does not materially change for practical values of the loss and the compensating delay, as previously shown from Equation [30]. This is illustrated in FIG. 5, which shows a plot of the movement of the dominant pole pair using normalized component values. The loss assumed is $G_1=G_2=0.1$, corresponding to a nominal Q of about 10 for zero delay. If the delay is increased to 0.1 times the gyrator resonant period, the dominant pole pair moves extremely close to the imaginary axis, so that the effect of the loss is cancelled and extremely high Q results. This behaviour confirms the conclusions of Equation [31], that the circuit exhibits equal sensitivity to delay and loss components for typical values of a practical implementation. Also from Equation [30], with the practical values of loss and delay given here, the gyrator resonant frequency moves only one percent from that of an ideal loss-less resonator with zero delay. Due to this fact, an oscillator with an accurately matched tracking filter can be made by using an identical resonator for the filter with increased nodal admittance. The key to achieving high Q factor filters and oscillators using a single-gyrator resonator is to adjust the delay so that the dominant pole pair is close to the imaginary axis. Remembering that the function of the delay is to increase the gyrator internal loop gain, a manufacturable high Q factor oscillator design can be achieved using automatic gain control to compensate for process and temperature variations. Other workers in this field have taken the approach of attempting to decrease the loss in order to increase the Q factor. This latter approach is particularly difficult to implement and has led to the use of non standard IC components to achieve the intended result. However the analysis presented here shows that there are alternative circuit techniques which do not require exotic technology for successful implementation. Thus a low Q factor gyrator with a Q of 10 may be easily adjusted to much higher Q factors by introducing a controlled transconductance delay. This will be illustrated later with the design of a practical single resonator VCO for 700 MHz having high effective Q factor and correspondingly low phase noise. Also, in this practical application a tracking prefilter is required and can be achieved by means of an identical resonator slaved to the VCO resonator and having an additional controlled loss. This filter design has application to direct conversion radio receivers as well as clock recovery circuits using clock extraction by filtering.

As shown in FIG. 5, as the gyrator transconductor delay increases so that the dominant pole pair crosses the imaginary axis, the gyrator frequency remains substantially constant. The significance of this is that we can build oscillators and filters which track each other accurately, and this is a primary requirement of a direct conversion receiver requiring a prefilter which tracks the local oscillator.

FIG. 5 also shows how much larger values of delay are allowed. It is clear that if only moderately high Q is required, or if large delay values are unavoidable, the gyrator frequency still continues to have a fairly constant value until the delay period becomes comparable to the period of oscillation.

Figure 6:
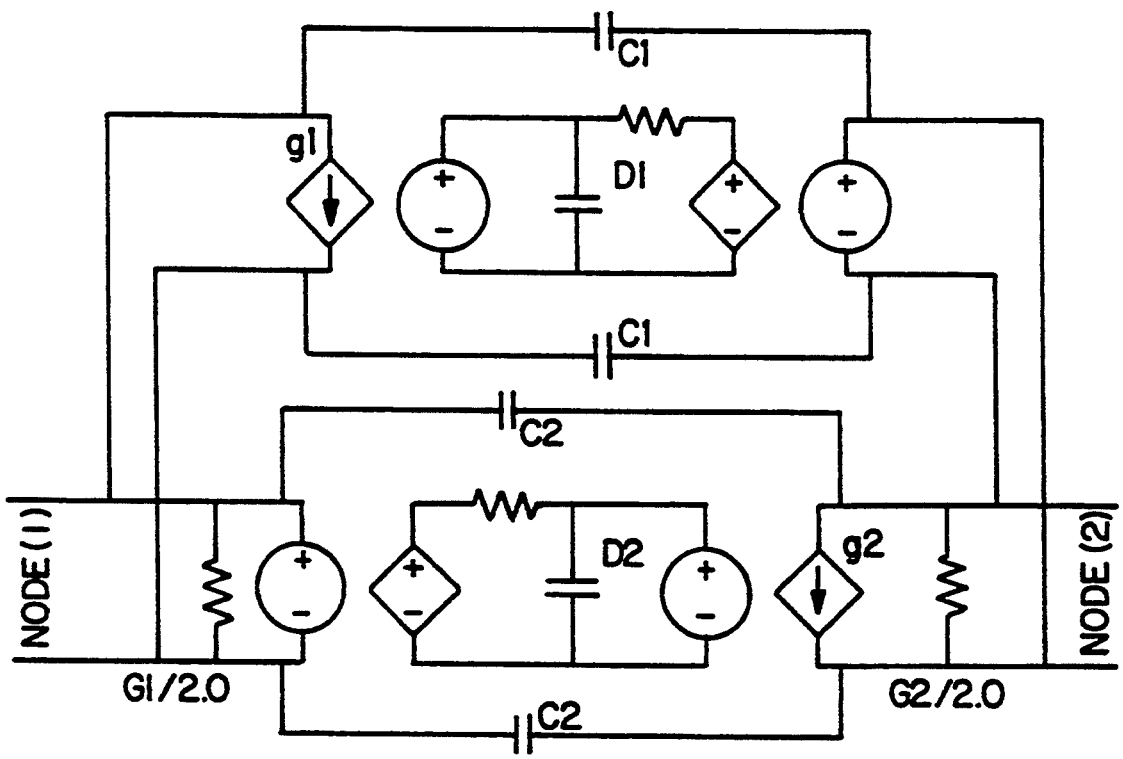
FIG. 6 is a circuit diagram of a differential gyrator resonator with feedback capacitors and delays.

So far the theoretical basis for the gyrator performance has been established on the classical gyrator circuit of FIG. 1 and its extension with built-in transconductance delay of FIG. 2. This enabled the relationship between delay and loss to be explored, with the conclusion that compensation of loss was possible, resulting in higher Q factor. In practice, alternative gyrator structures can be used with advantage, as illustrated in FIG. 6, where the gyrator capacitance is a feedback capacitance coupling the transconductor output to its input instead of shunting its output as previously considered. The most obvious difference that this approach creates is that the value of the capacitance seen at each port (and corresponding gyrator inductance) is a function of the circuit gain as a 'Miller' capacitance, i.e., the effective capacitance impedance of the transistors between their base and collector terminals. Secondly, and more importantly, the feedback capacitor helps to linearize the gyrator, a feature which is important in providing large signal oscillators and filters. For instance, maximization of the output power of the VCO is suggested by Equation [55] as a means of maximizing the effective Q factor. First of all, basic equations for the gyrator with delay and feedback capacitor will be derived.

FIG. 6 illustrates the new topology for the gyrator resonator. C1 and C2 designate the new feedback gyrator capacitances. Notice that each port is now loaded with impedances due to both feedback capacitances. The equivalent port impedance will now be calculated.

First of all, the effect of the feedback capacitor on the input of a VCCS can be calculated. Assuming the input voltage is $V_I$, the output voltage is $V_O$, the voltage gain is $A_V$, and the feedback current is $I_F$, then the input impedance is given by:

$$Z_I = \frac{V_I}{I_F} = \frac{V_I}{(V_O - V_I)j\omega C} = \frac{1}{(1 + A_V)j\omega C} \quad \text{(EQ 44)}$$

This is equivalent to a shunt capacitance of magnitude $(1+A_V) \cdot C$, or the Miller Capacitance. Similarly for the VCCS output circuit with output admittance G and transconductance g the output impedance $Z_O$ can be derived as:

$$Z_O = \frac{A_V}{((1 + A_V)j\omega C + g)} \quad \text{(EQ 45)}$$

Alternatively:

$$Z_O = \frac{1}{\left(1 + \frac{1}{A_V}\right)j\omega C + G} \quad \text{(EQ 46)}$$

This is equivalent to a shunt capacitance across the load of magnitude $(1+1/A_V) \cdot C$.

If we assume initially that the delays $D_1=D_2=0$ (FIG. 6), and assume an external voltage source $V_1$ at node (1), then the voltage $V_2$ at node 2 is given by:

$$V_2 = \quad \text{(EQ 47)}$$

$$g_2 V_1 \left( G_2 + j\omega \frac{C_1}{2}(1 + A_{V2}) + j\omega \frac{C_2}{2}\left(1 + \frac{1}{A_{V1}}\right) \right)^{-1}$$

Thus we can find the loop gain $\Gamma$ as:

$$\Gamma = \frac{-g_1 g_2}{\left( G_2 + j\omega \frac{C_1}{2}(1 + A_{V2}) + j\omega \frac{C_2}{2}\left(1 + \frac{1}{A_{V1}}\right) \right)\left( G_1 + j\omega \frac{C_2}{2}(1 + A_{V1}) + j\omega \frac{C_1}{2}\left(1 + \frac{1}{A_{V2}}\right) \right)} \quad \text{(EQ 48)}$$

And assuming $G_1=G_2=G$, $C_1=C_2=C$, $A_{V1}=A_{V2}=A$ and $g_1=g_2=g$, then we can write:

$$\Gamma = \frac{-g^2}{\left( G + j\omega \frac{C}{2}(1 + A) + j\omega \frac{C}{2}\left(1 + \frac{1}{A}\right) \right)^2} \quad \text{(EQ 49)}$$

Assuming the delay elements $D_1=D_2=D>0$, the loop gain with delay is obtained. Compare to Equations [21] and [28] for the shunt capacitance case:

$$\Gamma = \quad \text{(EQ 50)}$$

$$-g^2 \left( G + j\omega \frac{C}{2}(1 + A) + j\omega \frac{C}{2}\left(1 + \frac{1}{A}\right) \right)^{-2} (1 + j\omega D)^{-2}$$

The condition for unity gain is that $A=(0+j)$ for 90° phase shift, and $\Gamma=1$, so that by substituting in Equation [50] we obtain:

$$1 = \frac{-g^2}{(G + j\omega C)^2(1 + j\omega D)^2} \quad \text{(EQ 51)}$$

Whence, taking the square root:

$$gj = (G + j\omega C)(1 + j\omega D) \quad \text{(EQ 52)}$$

Simplifying Equation [52] by equating the real and imaginary parts we obtain two orthogonal conditions for unity gain, Equations [53] and [54]:

Equation [54] shows that the gyrator still has the same properties as before, namely that the delay D tends to compensate the loss G so that a condition for unity gain exists with maximum Q factor.

$$\omega_0 = \frac{g}{C + GD} \quad \text{(EQ 53)}$$

$$\omega_0 D = \frac{G}{\omega_0 C} \quad \text{(EQ 54)}$$

Comparing Equations [53] and [54] to Equations [30] and [31] we see that the sensitivities of $\omega_0$ to D and G are still equal and the conditions for unity gain are identical. It is interesting to observe that for the amplifier transistors in FIG. 11, collector base capacitance $C_{cb}$ has twice the effect of an equivalent base emitter capacitance $C_{be}$ (note that the base emitter capacitances appear in series across the gyrator ports). The dominant frequency controlling capacitance in this amplifier are the feedback capacitance 270,272 having a value of 1.5 pf. With these properties in mind, the effect of feedback and shunt capacitances can be added in parallel across the nodes using appropriate scaling to obtain the gyrator equivalent nodal capacitance.

Let us now consider the foregoing analysis in connection with low noise oscillators and tracking filters having high Q factor. It is known that a resonator is considered to be a tuned circuit consisting of two compound differential amplifiers coupled in a loop with negative DC phase, having a loop gain which may be greater, equal to, or less than unity. If the loop gain is greater than unity, the resonator is capable of oscillation. If the loop gain is less than unity, the resonator operates as a filter. At unity loop gain, the Q of the resonator becomes infinite. The resonator has two bidirectional ports and acts as an impedance transformer at the resonance frequency with quadrature phase.

Figure 7:
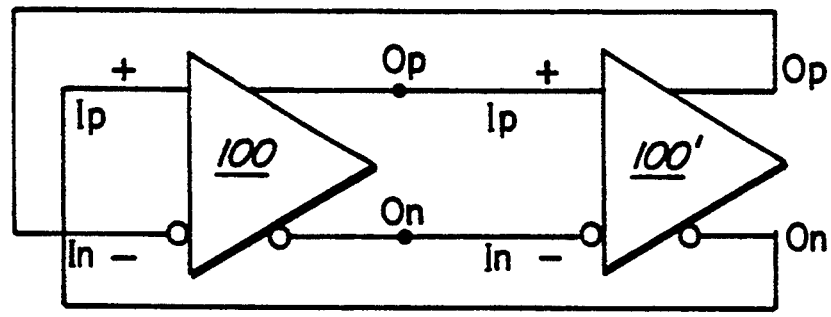
FIG. 7 illustrates a quadrature phase oscillator.

A conventional quadrature phase oscillator is shown in FIG. 7. The oscillator includes differential amplifiers 100 and 100'. The positive input of amplifier 100' is connected to the positive output of amplifier 100 and the negative input of amplifier 100' is connected to the negative output of amplifier 100. The positive input of amplifier 100 is connected to the negative output of amplifier 100' and the negative input of amplifier 100 is connected to the positive output of amplifier 100'.

Figure 8:
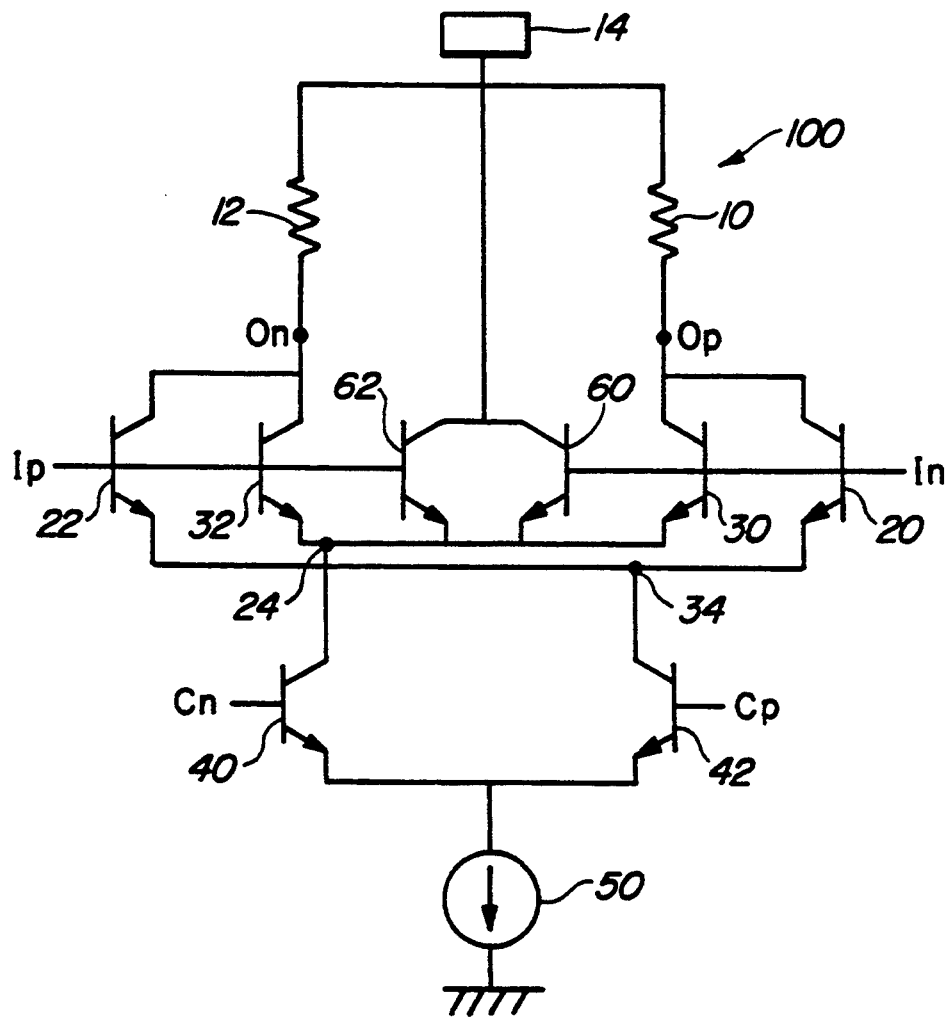
FIG. 8 is a circuit diagram of an oscillator tunable differential amplifier.

The differential amplifier 100 design is based upon a differential pair of bipolar junction transistors. A well-known property of the bipolar junction transistor is the way the transconductance phase shift tracks with $F_t$. As illustrated in FIG. 8, the differential amplifier circuit of the present invention comprises two input terminals $I_p$, $I_n$, and a differential output in the form of output terminals $O_p$, $O_n$. First and second matched load impedances 10, 12 (each approximately 1.5K Ohm) are connected between a power supply 14 and the differential output terminals $O_p$, $O_n$ respectively. A first pair of matched bipolar transistors 20, 22 has collectors connected to the differential output terminals $O_p$, $O_n$ respectively, bases connected to the differential input terminals $I_n$, $I_p$ respectively, and emitters connected to a common first node 24. A second pair of matched bipolar transistors 30, 32, has collectors connected to the differential output terminals $O_p$, $O_n$ respectively, bases connected to the differential input terminals $I_n$, $I_p$ respectively, and emitters connected to a common second node 34. A current dividing circuit in the form of a pair of matched bipolar transistors 40, 42 has collectors connected to the first and second nodes 24, 34, respectively, bases connected to differential control input terminals $C_n$, $C_p$ respectively, and emitters connected to a current source 50.

A further pair of transistors 60, 62 has collectors connected to the power source 14, bases connected to the input terminals $I_n$, $I_p$ respectively, and emitters connected to the common first node 24.

For the sake of clarity, auxiliary components such as Automatic Gain Control (AGC) and capacitors have not been shown in FIG. 8.

In operation of the differential amplifier the current source 50 supplies a substantially constant bias current which is divided between first and second current paths defined by the bipolar transistors 40, 42 respectively. A control voltage differential applied between the control input terminals $C_n$, $C_p$ controls the division of the bias current between the first differential pair 20,22 and the second differential pair 30, 32. In accordance with the embodiment shown in FIG. 8, the pair of transistors 60, 62 in association with transistors 30, 32 effectively shunt away some of the current steered to this pair and so effectively operates the pair at a lower transconductance. As was discussed with respect to Equation 53, the angular resonant frequency $\omega_0$ is directly dependent on transconductance g. It is to be understood, of course, that transistors 60, 62 could be arranged to operate in association with transistors 20, 22 in the same manner.

A pair of differential amplifiers as shown in FIG. 8 are connected in the configuration of FIG. 7 to form a gyrator based resonator and tuning is achieved by varying the effective transconductance of the amplifiers, i.e., by steering the current in relation to the shunted or non-shunted transistor pairs.

According to the prior art a simple expression for a VCO effective Q factor (Q') is given by:

$$Q' = Q \frac{2}{\pi} \frac{P}{FkTB} \qquad (EQ\ 55)$$

Where Q=resonator quality factor, P=power developed in the VCO load, F=amplifier noise factor, k=Boltzmann's Constant, T=temperature, B=resonator bandwidth.

Clearly from Equation 55 for optimum phase noise it is necessary to maximize the resonator Q factor and output power while minimizing the amplifier noise factor. As discussed previously, to maximize the resonator Q factor the gyrator is operated so that the loop gain is very close to unity. To achieve this and maximize power to the load, the amplifier must be linear up to large signal levels while maintaining gain close to unity by automatic gain control. Additionally, the amplifier and its tuning circuit must be designed for low noise factor. This consideration has been imported into the practical design shown in FIGS. 9 and 12.

Figure 9:
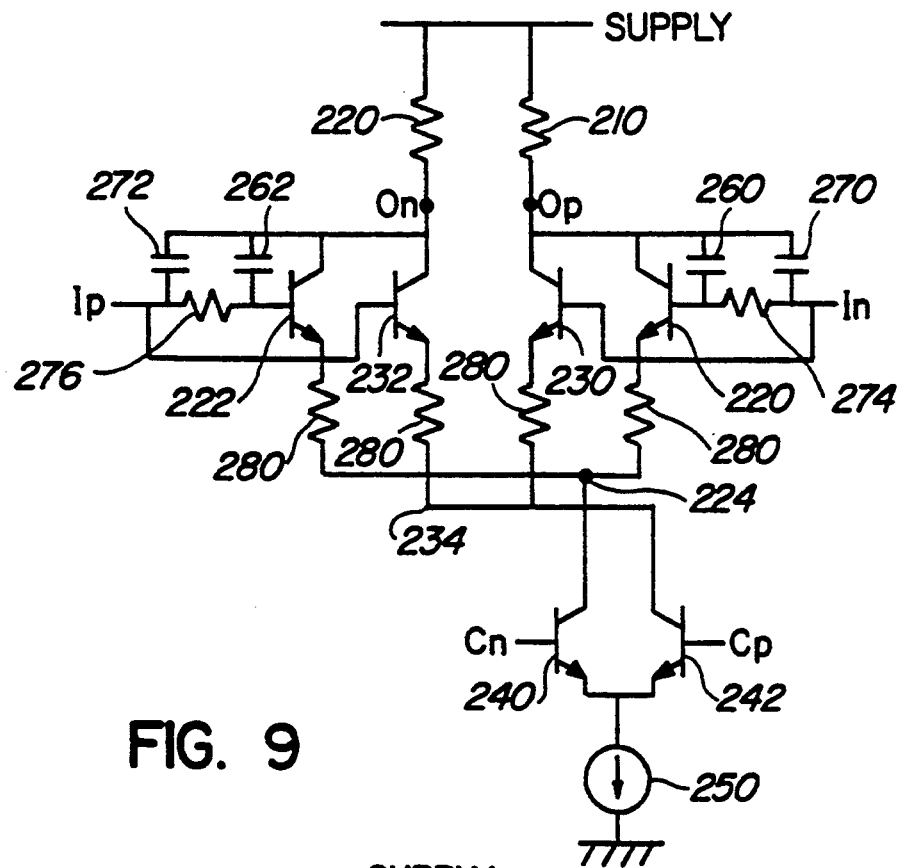
FIGS. 9 through 12 are circuit diagrams of embodiments of the invention.

In FIG. 9, differential amplifier 200 includes matched transistor pairs 220 and 222 having collectors connected to amplifier output $O_p$ and $O_n$ respectively, bases connected to $I_n$ and $I_p$ respectively, and emitters connected to node 224. Second transistor pair 230 and 232 have their collectors connected to amplifier output $O_p$ and $O_n$ respectively, bases connected to amplifier inputs $I_n$ and $I_p$ respectively, and emitters connected to node 234. Differential transistor pair 240 and 242 operate to steer current to the transistor pair 220, 222 or 230, 232, as previously discussed.

As previously described, the gyrator capacitances can be implemented as shunt nodal elements, or as transnodal feedback elements. The advantage of the latter approach is that the feedback effect of the capacitors tends to linearize the amplifier. In FIG. 9, capacitors 270, 272 serve as transnodal feedback elements. Additional linearization is necessary to achieve signal amplitudes of 0.5 volts and above. This can be achieved, for example, by means of emitter degeneration resistors providing series negative feedback. This is illustrated in FIG. 9 where resistors 280 which provide emitter degeneration to each one of the differential pairs to which they are connected provide, by this means, a well known form of series negative feedback which linearizes the gain of each of the differential pairs. Such application of series negative feedback will, of course, be implemented in each of the amplifiers 100, 100' of FIG. 7. Other means of linearization of these amplifiers may be employed alternatively in other embodiments of the invention.

The delay elements are implemented in the same technology as the capacitors and load resistors so that sensitivity to these components tend to cancel. However, at frequencies an order of magnitude below the transistor $F_t$, the transistor transconductance phase delay also becomes significant. Automatic gain control can be used to guarantee that the amplifier is operated in the linear region and hence very close to unity gain.

In FIG. 9, capacitors 260, 262 and resistors 274, 276 serve as the necessary delay elements.

It will be noted that transistors 230, 232 in FIG. 9 are larger than transistors 220, 222. The bias level is chosen so that transistors 220,222 are biased just at the peak of $F_t$. These transistors therefore have higher AC gain than the corresponding 15X transistors 230, 232 which, when turned on, are biased well below the peak $F_t$. The transconductance delay D for the larger transistors is chosen to be the actual delay of the transistors at the 90° phase shift frequency. To maximize the Q factor the collector load resistors 210, 220 can be chosen to give a value for G which satisfies the condition for oscillation given by Equation 54 under worse case conditions. Now, if the bias current is steered from the 15X transistors 230, 232 to the 5X transistors 220, 222, the effective delay D is increased due to the higher base resistance of the 5X transistors 220, 222 as well as the delay circuit. This begins to lower the resonant frequency, which in turn causes the amplifier gain to increase (by a factor of 2 or so) which has the effect of increasing the Miller capacitance, which in turn helps to lower the frequency further until a balance point is reached where the phase shift across the amplifier is 90°. By this means a tuning range of about 2:1 can be obtained with a suitable choice of component values. Note, that although the Q is maximized for the upper end of the frequency range, it is less (about half) for the lower end of the range. Also, the oscillation amplitude is controlled by the non-linearity of the amplifier and for maximized Q factor, this is not a desirable condition. Nevertheless, for many applications the performance of this circuit is adequate and typical noise for a 1.0 Ghz oscillator has been measured as 0.003 unit intervals (RMS). Finally, a particular point worth noting is that the transconductance G is not tuned in this version, but the effective value of the capacitance C is tuned.

As previously discussed with reference to Equation (53), the large tuning range of the VCO is not obtained by variation of the delay D.

Figure 10:
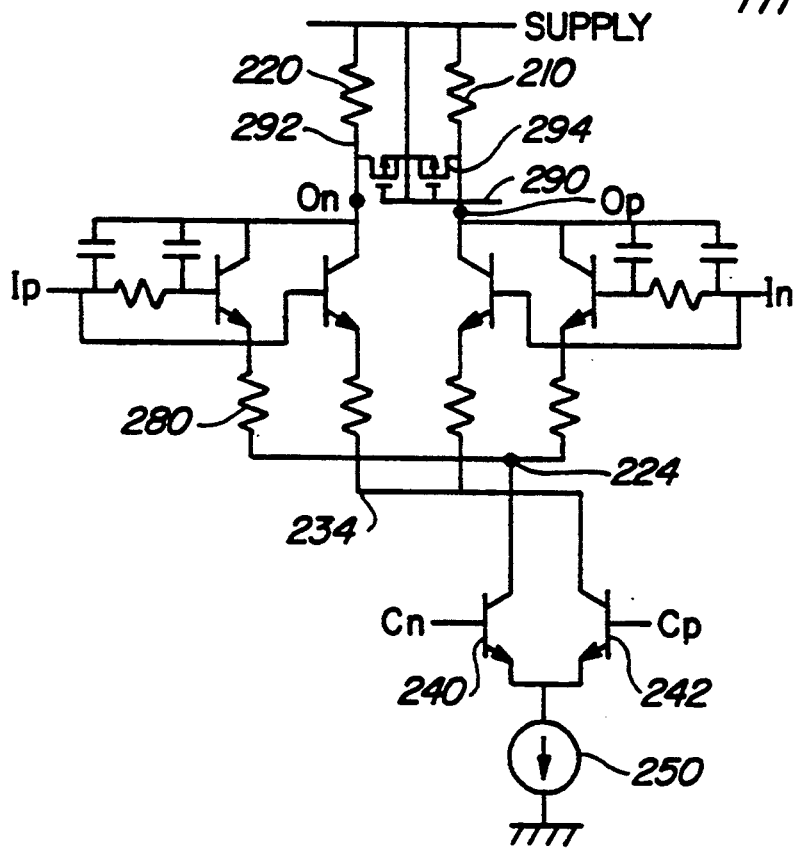

A further embodiment of the circuit of FIG. 9 is shown in FIG. 10 wherein AGC is applied to MOS transistors 294, 292 connected across the amplifier collector load resistors 210, 220, thus controlling the gyrator loss to obtain operation in the linear range of the amplifier and to optimize loss G with respect to delay D for close to unity gain. The circuit value of the collector load resistors 210, 220 is selected as before to maximize the Q factor at the upper end of the frequency range. As the bias current is steered from the 15X transistors 230, 232 to the 5X transistors 220, 222, the effective delay D is increased, thus lowering the frequency and increasing the gyrator loop gain. At this point the AGC operates to limit the gain by increasing the loss G.

Another consideration in the design of the tuning control is the contribution of the tuning control mechanism to amplifier noise and hence directly to oscillator phase noise.

Figure 11:
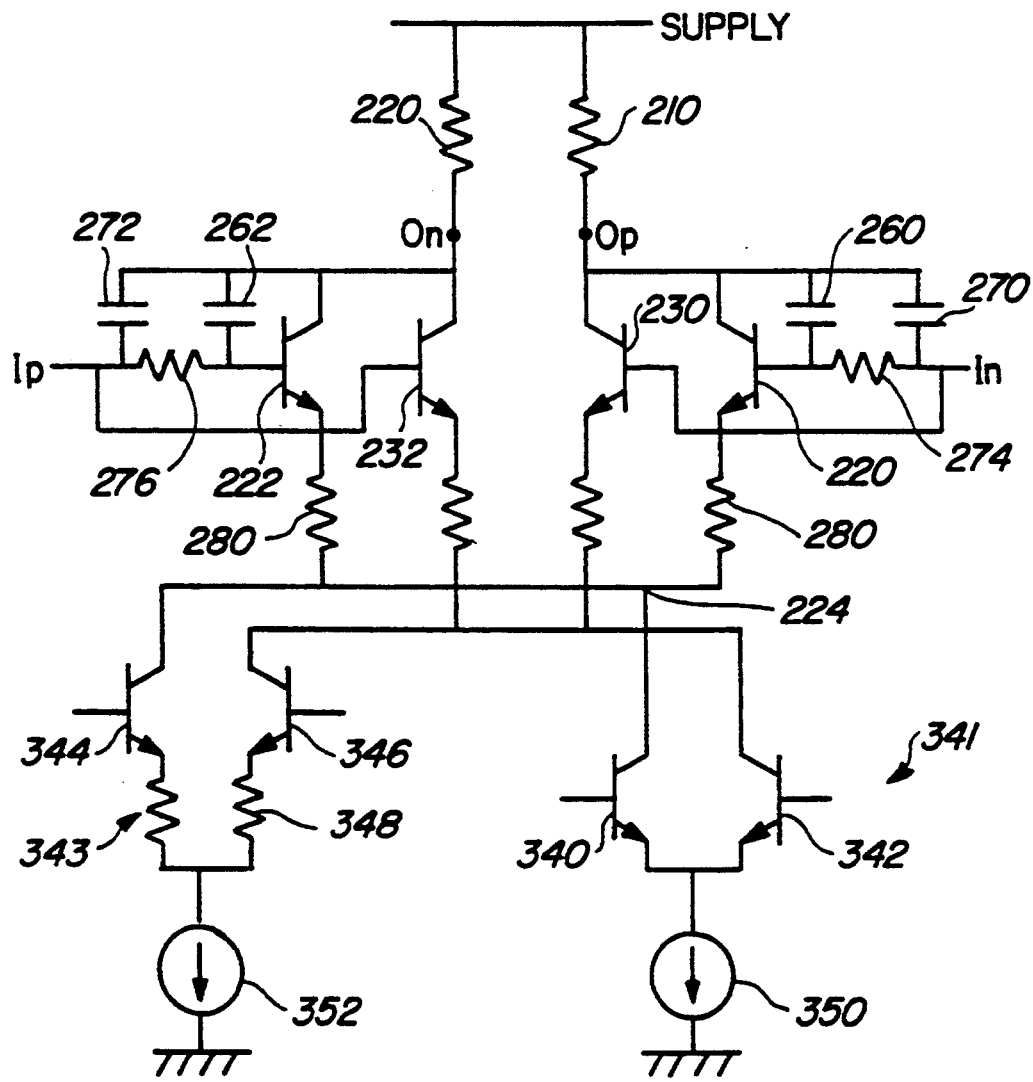

Low noise factor is achieved by means of large Bipolar transistors and particularly the tuning control is provided with coarse and fine adjustments. The principle aspects of a practical VCO amplifier, incorporating the gyrator capacitors, are illustrated in FIG. 11. Some refinements have been made, including the omission of the delay circuit from the base circuit of the amplifier 15X transistors since at the upper end of the frequency band the transistor internal delay is sufficient. For optimum noise performance the coarse control 343 is used to adjust the VCO frequency to compensate for process and temperature variations and in a practical application would be driven from a low impedance, such as a capacitively decoupled feedback loop with a long time constant. The fine tuning control 341 is intended for phase locking the VCO and because of its limited tuning range it contributes little to the VCO phase noise. Thus the VCO can be operated in a narrow bandwidth phase locked loop for minimum phase noise. Incidently the use of coarse and fine controls for VCO adjustment is standard practice for microwave oscillators.

As with all integrated tuned circuits, parasitic variations due to temperature and processing cover a wide range and as a consequence a wide tuning range is needed to compensate for these. Especially at very high frequencies, a tuning range approaching 2:1 is necessary. In such a case, to obtain minimum VCO phase noise, the tuning control noise referred to its output must be extremely small and without careful design may be of the order of pico volts. For example, a VCO centered on 700 Mhz with a tuning control range of ±50 mV is required to tune over a range of 400 Mhz (typically) thus setting the VCO gain at $4 \times 10^9$ Hz per volt. The VCO phase noise requirement is −68 dBc/Hz at an offset frequency from carrier of 13 Khz. Assuming a 3 dB impairment due to the tuning control, the equivalent input noise voltage is −177 dBV or 1.3 nV RMS. This is practically impossible to obtain. However, in the circuit design of FIG. 11 the course frequency control 343 is designed to operate over a 1.0 volt range by means of series resistive negative feedback 348. This reduces the equivalent noise referred to the tuning control input to −151.6 dBV or 26 nV RMS and this is achievable with a typical high frequency bipolar process such as BATMOS (proprietary BiCMOS process of Northern Telecom Limited). The tuning transistors 344, 346 for the course control are chosen to be 15X transistors with a noise figure better than 2 dB at a bias current of 10 mA.

Figure 12:
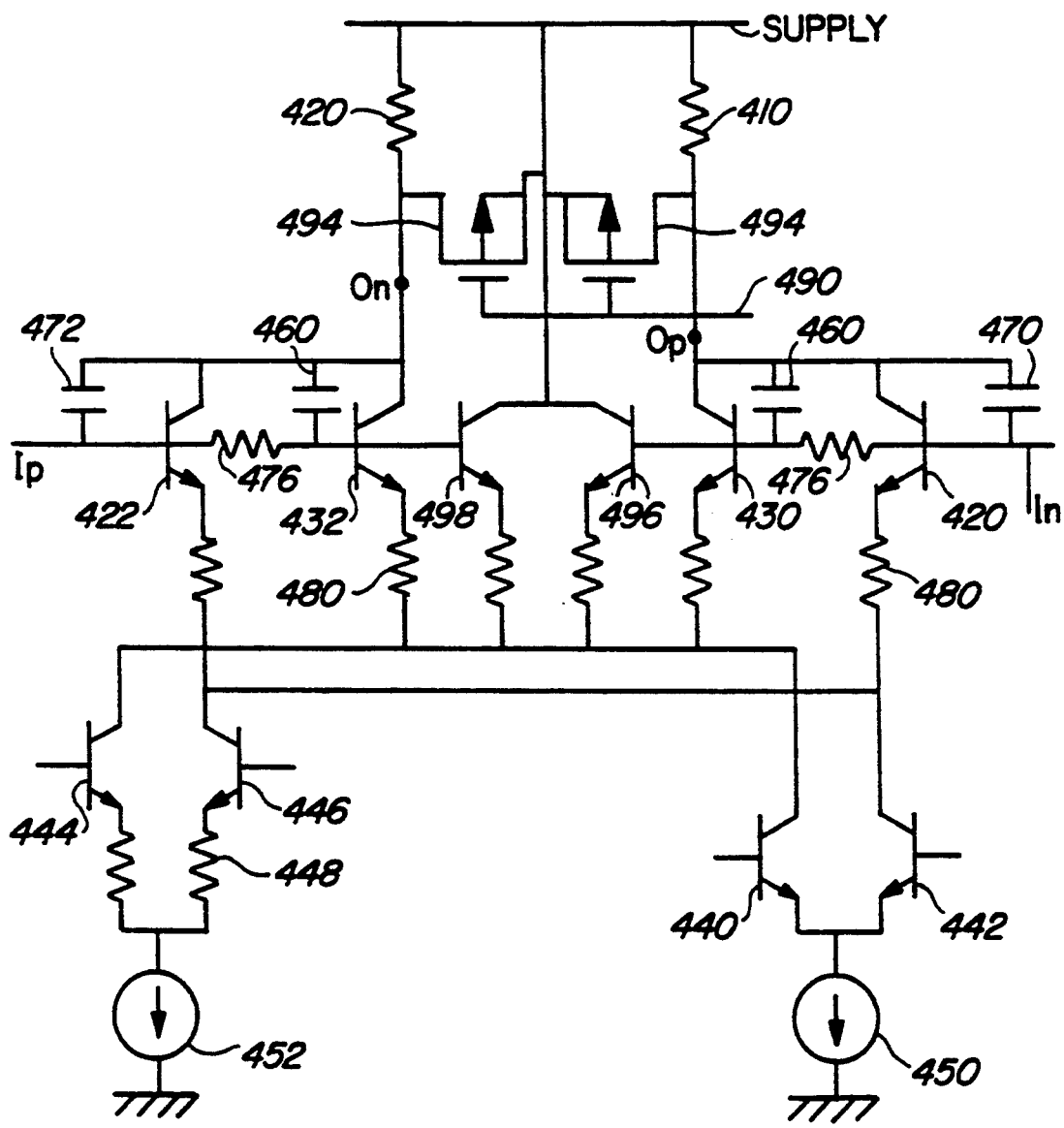

FIG. 12 shows a modified VCO circuit with transconductance tuning. The course low noise tuning control-frequency lock and the fine tuning control-phase lock of FIG. 11 are included. The embodiment of FIG. 12 also includes the AGC control. This arrangement keeps the voltage gain of the amplifier substantially constant and this prevents variation of the 'Miller' capacitance and reduces the tuning range of the VCO. This can be corrected by variation of the transconductance g as well as the transconductance delay D. The point to note is that in this arrangement control of the frequency is primarily by control of the transconductance g in accordance with Equations 53 and 54 to maintain the loop gain close to unity and thus maximize the Q factor. Thus AGC is used to optimize the oscillator Q factor over the whole of the tuning range. This then is a preferred arrangement for minimizing the VCO phase noise. Finally it should be pointed out that this arrangement for maximizing the Q factor only requires that the oscillator output amplitude is near the maximum consistent with maintaining amplifier linearity and is independent of processing and temperature variations. The particular topology chosen with the dominant feedback capacitance, and series negative resistive feedback, is optimized for linearity and high amplitude as required by Equation 55.

It will be noted that in FIG. 12, G and D can be varied simultaneously so as to keep the normalized delay $D_n$ substantially constant. In this embodiment the transconductance is determined by the magnitude of the current provided by the bias currents 450,452 to the transistor differential pairs 420,422 and 430,432. To obtain variable control of this transconductance, two extra 5X transistors 496, 498 are added to the 5X differential pair 430, 432 for the purpose of shunting off some of the bias current and so lowering the transconductance g for the 5X differential pair. As the bias current is steered from the large 15X differential pair 420, 422 to the smaller 5X pair transductance g is reduced and $\omega_0$ is lowered as given in Equation 53 so that we need to increase the delay D to maintain fairly constant loop gain and this is accomplished by the base input delay circuit 460, 476 of each 5X transistor pair so that the normalized delay $D_n$ remains substantially constant. Since the condition for unity gain is that $D_n = G_n$, this means that as $\omega_0$ is lowered we must reduce the loss G (Equation 54).

The combined noise figure for the amplifier of FIG. 12 is about 2 dB. This does not include the contribution of noise from the tuning circuit, which is assumed to be of a similar magnitude (this depends on the external circuit and can with careful design be less). Consequently a conservative noise figure for the complete amplifier of 6 dB is used for calculations.

Improvement in the phase noise of the example oscillator can be obtained by increasing the resonator Q. There is a trade-off between oscillator power and Q factor for a given VCO. In general, the phase noise is inversely proportional to the square of the Q factor and is inversely proportional to the signal power. Consequently, minimum phase noise can generally be obtained by maximizing the resonator signal power consistent with amplifier linearity and near unity resonator loop gain.

The example VCO was simulated with collector load resistors of 210 ohms, shunted by large P channel MOS transistors (w=114 μm, 1=0.8 μm) under the control of an external level detector to act as an AGC. After establishing the operating point with stable AGC control, the circuit was resimulated to determine the resonator Q factor. A Q factor of 181 was obtained at an output voltage swing of 0.2 volts p/p at an operating current level of 9.67 mA in each half of the differential pair and an equivalent load resistance of 113 ohms. The total resonator signal power was 1.41 mW. Based on this the phase noise at 10 kHz offset frequency from the carrier at 848 MHz was −82.4 dBc/Hz, which projects an integrated double sideband noise over the band from 13 kHz to 2.5 MHz of −43.4 dBc. If we allow 3 dB impairment for the tuning control noise, this translates to a tuning input noise level of 17 nV rms for a tuning range of ±15% with a 124 ohm tuning transistor emitter degeneration resistor. The coarse tuning control input can be capacitively decoupled to achieve this noise level, otherwise careful design of the external control is required. The results recorded here illustrate the capability of this design approach but do not represent an optimized design.

Figure 13:
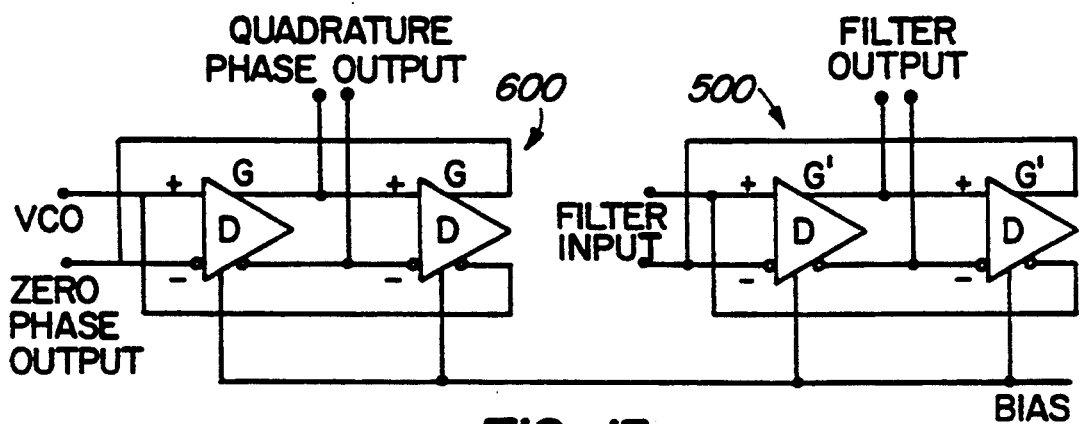
FIG. 13 illustrates an oscillator and slaved tracking filter.

Finally, to provide a high Q prefilter gyrator which tracks the frequency of the VCO of FIG. 11, a duplicate gyrator is slaved to the VCO frequency and bias controls, and increased loss is introduced by lowering the values of the collector load resistors. Since the VCO operates very close to unity gain and with guaranteed close matching of the integrated slaved gyrator, the filter gyrator's dominant pole pair can be placed just inside the negative left hand side of the S-plane, guaranteeing stability and high Q factor. FIG. 13 illustrates a filter-oscillator combination. The filter 500 and oscillator 600 have the same circuit elements except for loss admittance G, G'. In FIG. 13, D represents the transconductance delay elements and G, G' represents admittance loss elements. In accordance with the previous discussion the nodal loss admittance for the filter G' is slightly larger than the nodal loss admittance of oscillator G. Typically $G' \approx 1.1\, G$.

As discussed above, the tracking filter employs circuit topology which is identical to that of the associated oscillator with the exception of the slightly increased nodal loss admittance. This arrangement therefore achieves an enhanced Q factor due to the operation of the shared oscillator AGC system to which it is connected. In addition, for operation as a filter, a means is required for injecting a signal into the filter gyrator. FIG. 13 illustrates the use of one port of the gyrator as a signal output port. In one embodiment of the invention, the signal source for the filter was a high impedance circuit, provided by the drain connections of a MOS transistor differential pair. Alternatively, since it is a requirement that the loss admittance of the filter gyrator be greater than the loss admittance of the oscillator, this increased loss can be provided by the controlled output impedance of the signal source which shunts the filter gyrator nodal impedance. The coupling of gyrator circuits and the impedance matching requirements thereof are a well known art and many variations are possible which are within the scope of this invention. The point to be maintained is that the oscillator and filter gyrator circuits differ only in the slight increase of the loss admittance of the filter gyrator, while the two circuits share the same tuning and AGC controls.

Lastly, in accordance with the aims of U.S. Pat. Nos. 5,172,076 and 5,185,581, the collector load resistors of the gyrators described can be tapped to provide a gain difference between the ports of the gyrator which is useful for enhancing the quality factor Q of multiple resonator circuits constructed from such gyrators.

These and other modifications are within the scope of the invention as defined by the following claims.

I claim:

1. A gyrator based resonator comprising:
   first and second differential amplifiers each having:
   a current source for supplying a substantially constant bias source:
   a current dividing circuit for controllably dividing the substantially constant bias source between first and second current paths;
   a pair of matched load impedances;
   a first pair of matched transistors connected as a differential pair between the matched load impedances and the first current path;
   a second pair of matched transistors connected as a differential pair between the matched load impedances and the second current path, with differential inputs of the second differential pair connected to corresponding differential inputs of the first differential pair and;
   a third pair of transistors associated with one of said first or second pairs of matched transistors to control the transconductance delay thereof.

2. A gyrator based resonator as defined in claim 1 wherein a positive input of the second differential amplifier is connected to a positive output of the first differential amplifier, a negative input of the second differential amplifier is connected to a negative output of the first differential amplifier, a positive input of the first differential amplifier is connected to a negative output of the second differential amplifier and, a negative input of the first differential amplifier is connected to a positive output of the second differential amplifier.

3. A gyrator based resonator as defined in claim 2 wherein the means to control the transconductance delay of the first pair of transistors controls the resonant frequency of the resonator.

4. A gyrator based resonator as defined in claim 3 said transconductance delay means being operable to vary the loop gain of said resonator.

5. A gyrator based resonator as defined in claim 4 having adjustable loss admittance means operable to vary the loop gain of said resonator.

6. A gyrator based resonator as defined in claim 5 having loops gain greater than unity for operation as oscillator.

7. A gyrator based resonator as defined in claim 6 having a level detecting circuit operable with said loss admittance means to vary the loop gain of said resonator.

8. A gyrator based resonator as defined in claim 5 having loop gain less than unity for use in a tuned circuit.

9. A gyrator based resonator as defined in claim 5 having feedback capacitors to enhance the linearity of said resonator.

10. A gyrator based resonator as defined in claim 5 having series emitter degenerator resistors to enhance the linearity of said resonator.

11. A combination oscillator and tracking filter comprising first and second interconnected gyrator based resonators as defined in claim 2, said first resonator having loop gain greater than unity to operate as an oscillator and said second resonator having loop gain less than unity to operate as a tuned filter.

12. A combination oscillator and tracking filter as defined in claim 11 wherein the loop gain of said first resonator is controlled by a transconductance delay means and a first loss admittance means.

13. A combination oscillator and tracking filter as defined in claim 12 wherein the loop gain of said second resonator is controlled by said transconductance delay means and a second loss admittance means slaved to said first loss admittance means, said second loss admittance means being greater than said first loss admittance means.

14. A combination as defined in claim 13 wherein said second loss admittance means is typically 10% greater than said first loss admittance means.

15. A combination as defined in claim 13 having a level detecting circuit operable with said first and second loss admittance means to vary the loop gain of said resonators.

16. A combination as defined in claim 13 wherein said resonators include linearity enhancement capacitors.

17. A combination as defined in claim 13 wherein said resonators have series emitter degenerator resistors to enhance the linearity thereof.

18. A combination as defined in claim 13 wherein the loop gain of said first resonator and the loop gain of said second oscillator are close to unity.

19. A combination as defined in claim 18 wherein the resonant frequency of said oscillator and said tuned filter is the same.

20. A gyrator based resonator comprising;
a pair of interconnected transconductance elements, transconductance delay means associated with said transconductance elements to control the transconductance delay. of said resonator and adjustable loss admittance means.

21. A gyrator based resonator as defined in claim 20, said transconductance delay means and said loss admittance means being operable to vary the loop gain of said resonator.

22. A gyrator based resonator as defined in claim 21, said loop gain being variable from less than unity wherein said resonator operates as a filter to greater than unity wherein said resonator operates as an oscillator.

23. A gyrator based resonator as defined in claim 22 the resonant frequency being defined by the formula:

$$W = \frac{g}{C + GD}$$

and the transconductance delay for unity gain being defined by the formula:

$$D = \frac{G}{W^2 C}$$

where:
W = resonant frequency
g = transconductance
C = gyrator capacitance
D = transconductance delay
G = loss admittance.

* * * * *

UNITED STATES PATENT AND TRADEMARK OFFICE
CERTIFICATE OF CORRECTION

PATENT NO. : 5,371,475
DATED : December 6, 1994
INVENTOR(S) : BROWN, A.K.D.

It is certified that error appears in the above-indentified patent and that said Letters Patent is hereby corrected as shown below:

COLUMN 7, LINE 20

Change "$(R_d.C_d 32D)$" to

-- $(R_d.C_d=D)$ --

COLUMN 10, LINE 57

Insert -- $D_n = G_n$    (EQ 42) --

Signed and Sealed this

Fifteenth Day of August, 1995

Attest:

BRUCE LEHMAN

*Attesting Officer*    *Commissioner of Patents and Trademarks*